United States Patent
Müller et al.

(10) Patent No.: US 10,186,821 B2
(45) Date of Patent: Jan. 22, 2019

(54) MODULAR BUS SYSTEM

(71) Applicant: Phoenix Contact GmbH & Co. KG, Blomberg (DE)

(72) Inventors: Frank Müller, Detmold (DE); Peter Wermter, Blomberg (DE)

(73) Assignee: Phoenix Contact GmbH & Co. KG, Blomberg (DE)

( * ) Notice: Subject to any disclaimer, the term of this patent is extended or adjusted under 35 U.S.C. 154(b) by 0 days.

(21) Appl. No.: 15/560,016

(22) PCT Filed: Mar. 23, 2016

(86) PCT No.: PCT/EP2016/056385
§ 371 (c)(1),
(2) Date: Sep. 20, 2017

(87) PCT Pub. No.: WO2016/151019
PCT Pub. Date: Sep. 29, 2016

(65) Prior Publication Data
US 2018/0069359 A1 Mar. 8, 2018

(30) Foreign Application Priority Data
Mar. 23, 2015 (DE) .................... 10 2015 104 290

(51) Int. Cl.
*H01R 25/16* (2006.01)
*H01R 9/26* (2006.01)
(Continued)

(52) U.S. Cl.
CPC ......... *H01R 25/165* (2013.01); *H01R 9/2658* (2013.01); *H01R 9/2675* (2013.01);
(Continued)

(58) Field of Classification Search
CPC ...... H01R 9/26; H01R 9/2608; H01R 9/2616; H01R 9/2625; H01R 9/2633;
(Continued)

(56) References Cited

U.S. PATENT DOCUMENTS

| 6,033,268 A | * | 3/2000 | Piper | ........................ H01R 9/22 439/715 |
| 8,758,061 B2 | | 6/2014 | Mische et al. | |

(Continued)

FOREIGN PATENT DOCUMENTS

| JP | 03-016383 U | 2/1991 |
| JP | 2009-211838 A | 9/2009 |
| JP | 2011-185612 A | 9/2011 |

OTHER PUBLICATIONS

Authorized Officer: Martinez Orta, Maxima, "International Search Report and Written Opinion" issued in counterpart PCT application No. PCT/EP2016/056385, dated Jul. 5, 2016.

(Continued)

*Primary Examiner* — Ross N Gushi
(74) *Attorney, Agent, or Firm* — Kaplan Breyer Schwarz, LLP

(57) ABSTRACT

A modular bus system including a support rail having a base and a longitudinal axis; at least one base module, mountable on the support rail, for electrical connection to at least one input/output functional module having a backplane printed circuit board with at least one group of at least two first electrical connectors connected thereto, for electrical connection to an electrical connector of an input/output functional module, the first electrical connectors of the group arranged one after the other along an imaginary line that extends perpendicular to the longitudinal direction of the support rail and lie in a plane in which the base of the support rail is located or which is parallel to the base; at least one input/output functional module having an electrical (Continued)

connector and an electronic device for communication with the modular bus system, the electrical connector of the input/output functional module configured for electrical connection to one of the electrical connectors of the base module.

10 Claims, 11 Drawing Sheets

(51) Int. Cl.
    *H05K 7/14*     (2006.01)
    *H01R 12/71*     (2011.01)
    *H01R 12/72*     (2011.01)
    *H01R 12/73*     (2011.01)

(52) U.S. Cl.
    CPC ......... *H01R 12/716* (2013.01); *H01R 12/722* (2013.01); *H01R 12/732* (2013.01); *H01R 25/168* (2013.01); *H05K 7/1468* (2013.01); *H05K 7/1475* (2013.01)

(58) Field of Classification Search
    CPC .... H01R 9/2641; H01R 9/265; H01R 9/2658; H01R 9/2666; H01R 9/2675; H01R 9/2683; H01R 9/2691
    USPC .......................................................... 439/716
    See application file for complete search history.

(56) References Cited

U.S. PATENT DOCUMENTS

2012/0290759 A1    11/2012    Blair et al.
2013/0045613 A1    2/2013    Griese et al.

OTHER PUBLICATIONS

Office Action issued in Japanese patent application No. 2017-549774, dated Sep 28, 2018, 9 pp.

\* cited by examiner

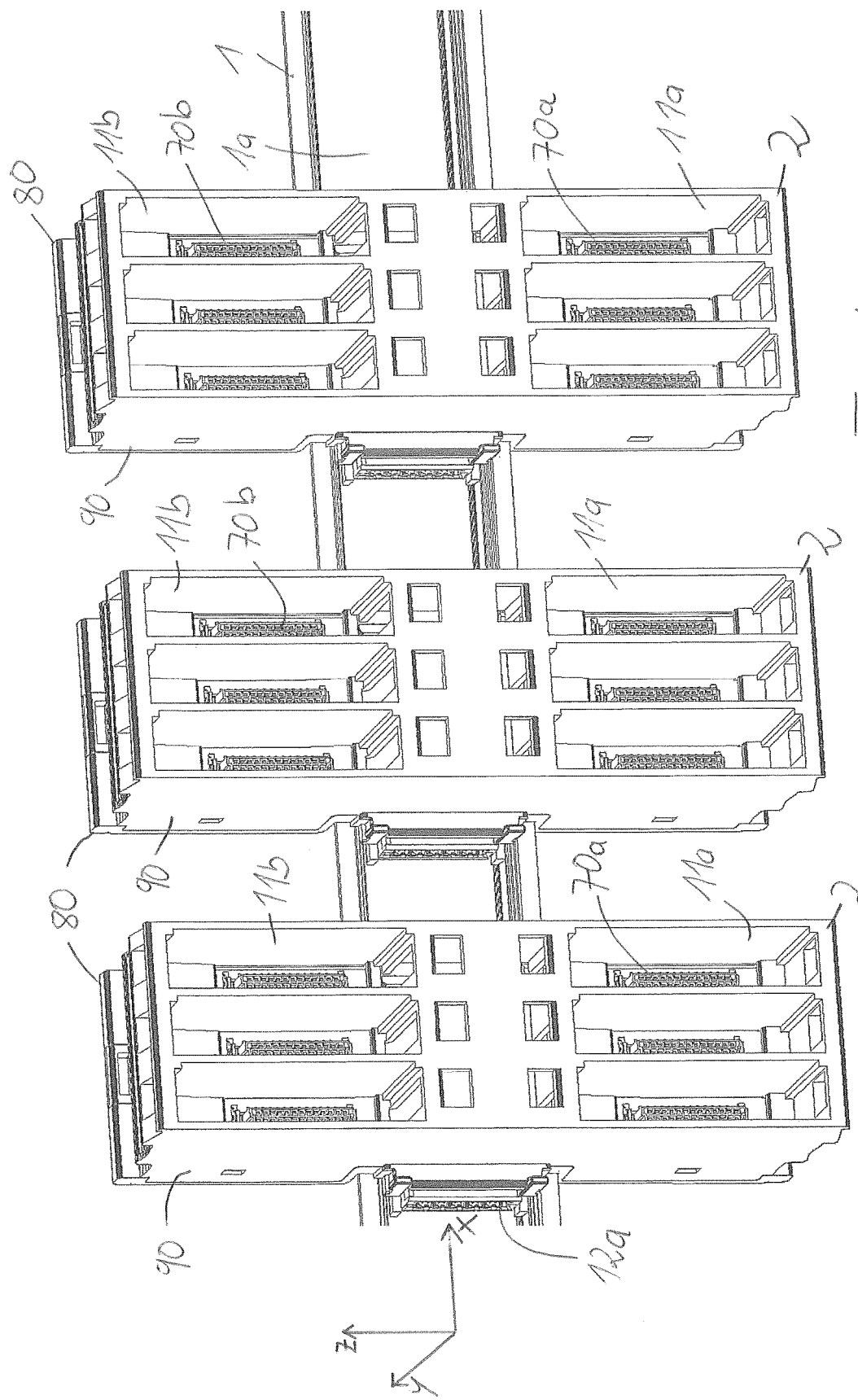

MODULAR BUS SYSTEM

FIELD OF THE INVENTION

The invention relates to a modular bus system comprising individual input/output functional modules that are arranged side by side in a direction along a support rail.

The individual functional units or modules may have different installation widths, number of channels and number of connection elements, which then results in a specific overall width for the overall functionality at the station. In practice, a certain rigidity exists as to the space requirement for the various units or modules. For example, if fewer channels are required for overall functionality than provided by the existing units or modules, space is wasted along the support rail.

From DE 20 2011 000 835 U1, a connection system is known for connecting connection modules and/or functional modules with bus capability. The connection system comprises a connection block with a plurality of plug-in slots.

SUMMARY OF THE INVENTION

The invention is based on the object of providing more flexibility in the arrangement of input/output functional modules and their communication options in a modular bus system.

What can be considered as a key idea of the invention is to equip input/output functional modules with an integrated electronic device for communication with the modular bus system and to arrange them not only along the longitudinal direction of the support rail but also transversely to the rail.

The technical problem stated above is solved by the features of claim 1.

Accordingly, a modular bus system is provided, comprising the following features:

- a support rail having a base and a longitudinal axis;
- at least one base module mountable on the support rail for electrical connection to at least one input/output functional module that has a backplane printed circuit board with at least one group of at least two first electrical connectors connected thereto for electrical connection to an electrical connector of an input/output functional module, wherein the at least two first electrical connectors of the at least one group are arranged in tandem, i.e. one behind the other, along an imaginary line which extends perpendicular to the longitudinal direction of the support rail and lie in a plane in which the base of the support rail is located or which is parallel to the base;
- at least one input/output functional module comprising an electrical connector and an electronic device for communication with the modular bus system, wherein the electrical connector of the input/output functional module is configured for being electrically connected to one of the electrical connectors of the at least one base module.

Preferably, a second electrical connector is provided on at least one side of the backplane printed circuit board of the at least one base module, which is perpendicular to the longitudinal axis of the support rail, for being electrically connected to a complementary second electrical connector of a further base module, the complementary second electrical connector being arranged on a side of a backplane printed circuit board of the further base module, which is perpendicular to the longitudinal axis of the support rail.

It should be noted that the first and second electrical connectors can be provided in the form of plug-in slots.

Furthermore preferably, an electronic device is arranged on the backplane printed circuit board of the at least one base module, which electronic device is configured for communication with the electronic device of the at least one input/output functional module.

Advantageously, the electronic device of the at least one base module is electrically connected to the first electrical connectors and to the at least one second electrical connector and is adapted to detect whether an input/output functional module is connected to any one of the first electrical connectors, and if so, to which one(s) of the first electrical connectors an input/output functional module is connected.

Furthermore advantageously, the electronic device of the at least one base module is configured to selectively connect the first electrical connectors and the at least one second electrical connector so that input/output functional modules connected to the at least one base module are able to communicate with each other and/or with the electronic device and/or with input/output functional modules that are connected to another base module.

Favorably, the at least one base module comprises a receptacle body which has at least one group of at least two receptacle areas, wherein each receptacle area extends perpendicular to the base of the support rail and is configured to accommodate at least in part an input/output functional module, wherein the at least two receptacle areas of the at least one group are arranged in tandem, i.e. one after the other, along an imaginary line which extends perpendicular to the longitudinal direction of the support rail and lie in a plane in which the base of the support rail is located or which is parallel to the base, wherein each receptacle area is associated with one of the first electrical connectors.

Advantageously, the at least one base module includes a support plate which is mountable to the support rail and is configured to support the backplane printed circuit board and the receptacle body.

In an advantageous further embodiment, a header module is provided which is electrically connectable to a header base module, wherein the header base module includes an electrical connector for being electrically connected to the at least one base module.

In an advantageous further embodiment, the header module is configured for communication with the input/output functional modules connected to the at least one base module.

According to an advantageous embodiment of the invention, a plurality of base modules are arranged side by side on the support rail, so that the vertical plug-in slots form a grid. The grid comprises at least two rows of plug-in slots arranged one above the other. In this manner, it is possible to combine more different input/output functional modules within a specific installation width to obtain a station. The installation width of the individual input/output functional modules does not need to be consistent, rather it is likewise possible to choose the double or multiple of the grid unit for the installation width, that is to say one input/output functional module may occupy two or more grid units.

The modular bus system may comprise a header module which is connected to the at least one base module via a horizontal plug-in slot. The dimension of the header module in the longitudinal direction of the rail is approximately that of the predefined grid, but may be smaller than or larger than the width of a base module.

The modular bus system advantageously comprises a bus coupler which is connected to the header module via a header base module. This header base module complies with the grid of the system and usually occupies a larger width than the common base module.

It is also possible for the header module and the bus coupler to form, in a fixed combination, a base block module having a shared backplane printed circuit board which is provided with a horizontal plug-in slot and a plurality of vertical plug-in slots for connecting the header module and a group of input/output functional modules. Such a base block module may itself define a bus station, but it is also possible to connect further base modules via the horizontal plug-in slot and to equip the further base modules with further input/output functional modules, thus enabling to build larger bus stations with more functionalities.

BRIEF DESCRIPTION OF THE DRAWINGS

Exemplary embodiments of the invention will now be described with reference to the drawings, wherein:

FIG. 1 shows an exemplary modular bus system with three base modules which are separately mounted on a support rail side by side;

DETAILED DESCRIPTION OF THE INVENTION

Figure 8:
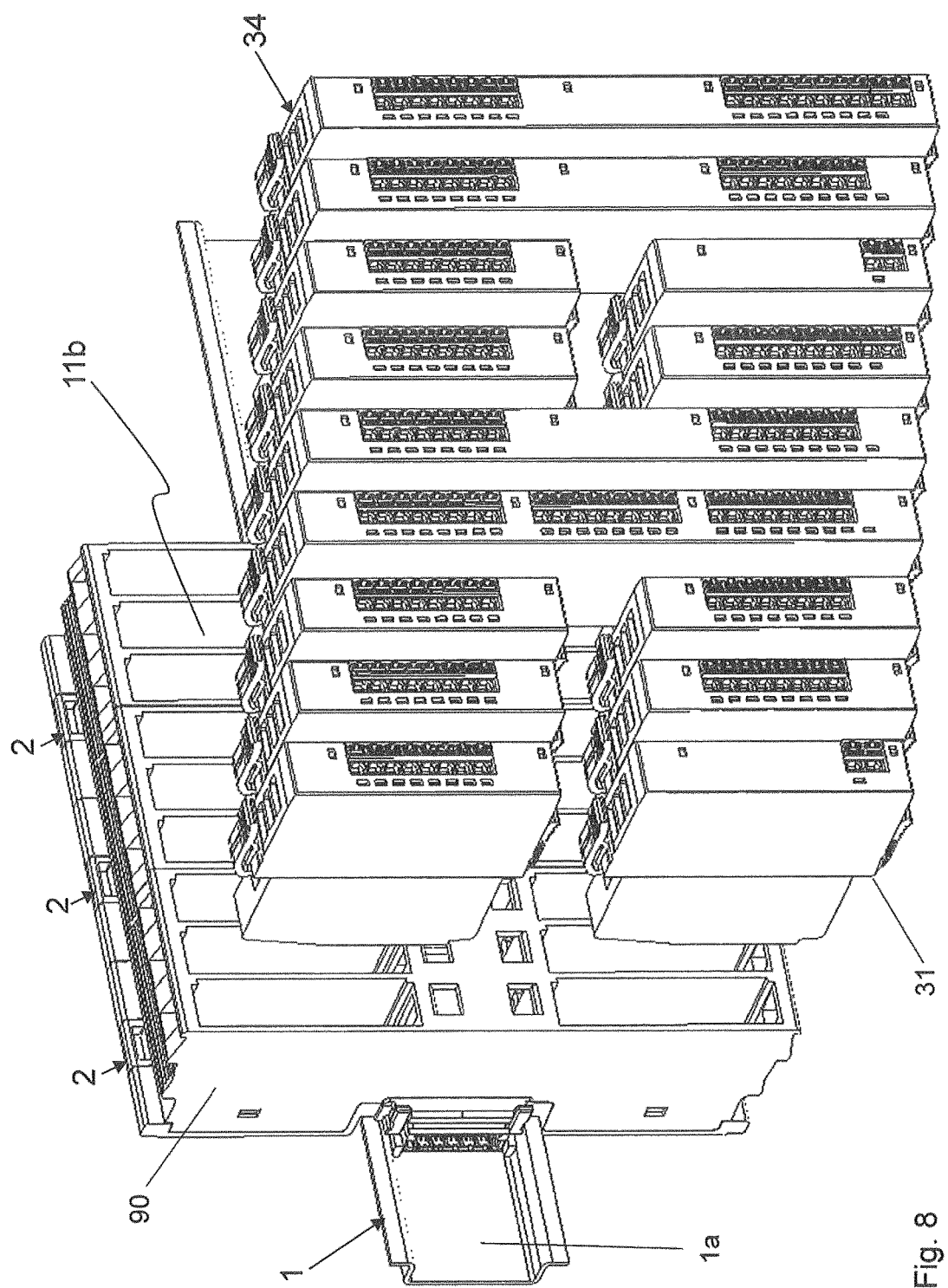
FIG. 8 shows the modular bus system of FIG. 1 with combined base modules and various input/output functional modules about to be inserted into the base modules.
Figure 9:
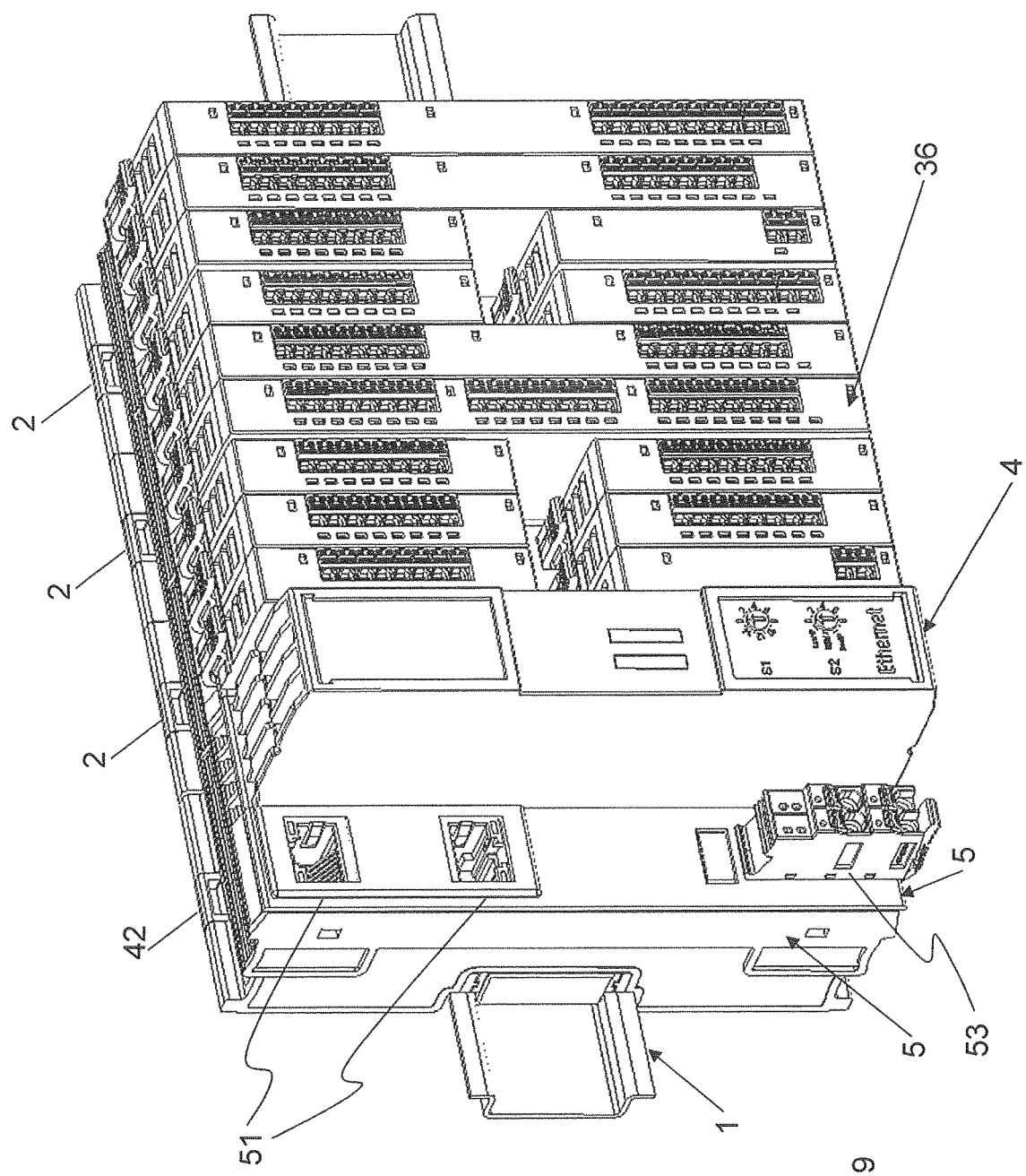
FIG. 9 shows the modular bus system illustrated in FIGS. 1 and 8, with the input/output functional modules inserted in the base modules, and with an input/output bus station including a header module.

FIG. 1 shows a portion of an exemplary modular bus system 100 with three decoupled base modules 2, which are mounted spaced from one another on a support rail 1, preferably plugged to the support rail 1. It should already be noted at this point that for proper operation the base modules 2 are electrically connected to each other, and optionally mechanically as well, as shown in FIG. 8 or 9, for example.

The geometrical alignment of the base modules 2 and their components with respect to the support rail 1 can be explained most easily with the aid of a 3D coordinate system with axes x, y, and z, wherein in FIG. 1 the longitudinal axis of the support rail 1 coincides with the x-axis. Support rail 1 has a base 1a which extends in the x-direction in the view chosen in FIG. 1, and which is located in a plane spanned by the x- and z-axes. It should be noted at this point that the support rail 1 is arranged in the same plane in FIGS. 8, 9, 11, 13, and 14. Only in FIGS. 10 and 12 the longitudinal axis of the support rail 1 extends in parallel to the y-axis and the base 1a of the support rail is located in a plane spanned by the y- and z-axes.

Figure 10:
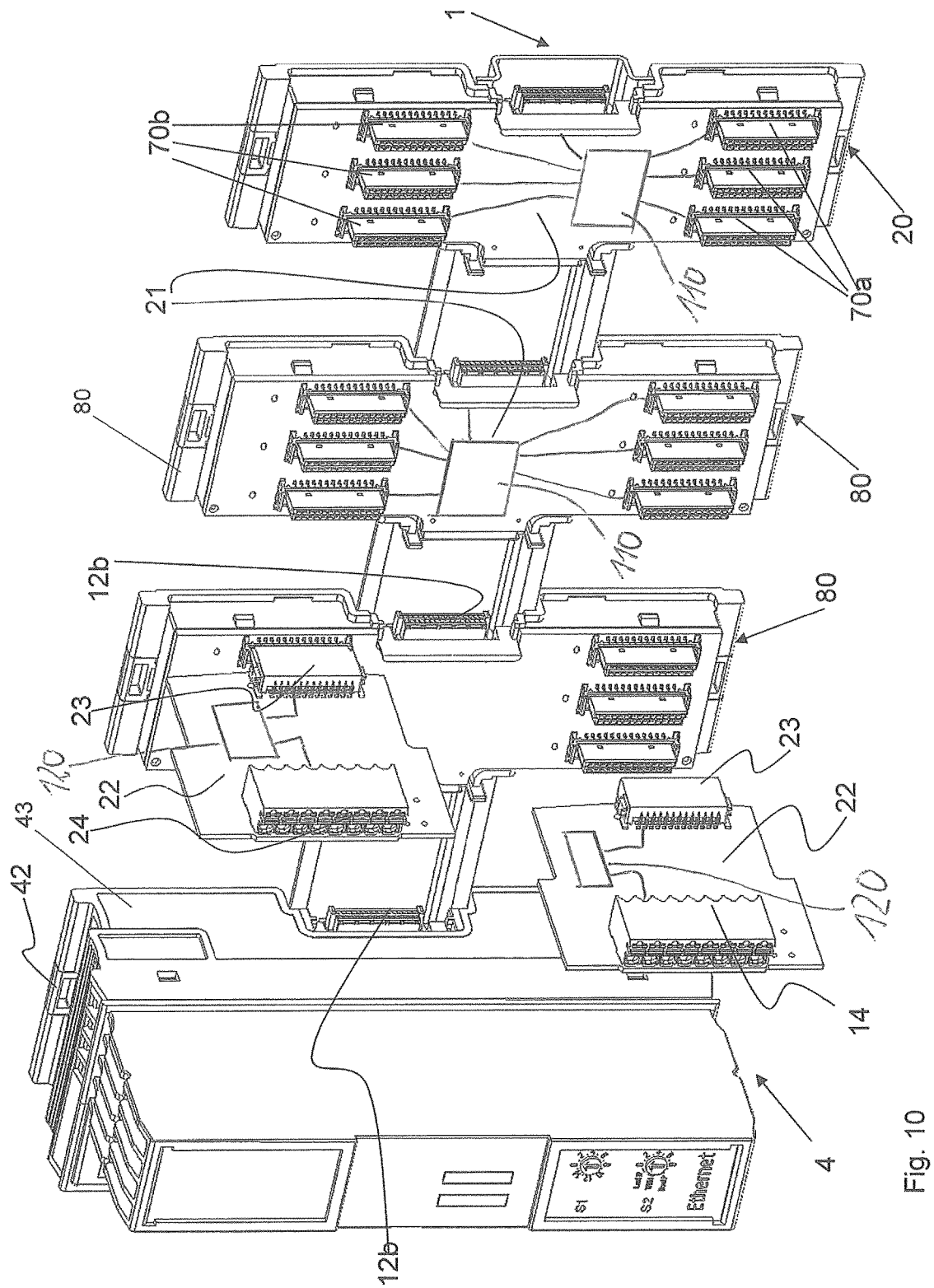
FIG. 10 shows the modular bus system of FIG. 9 with the base modules decoupled, the backplane printed circuit boards of the base modules exposed, and with two printed circuit boards of the input/output functional module shown in FIG. 2.

Now, FIGS. 1 and 10 will be considered together.

Figure 2:
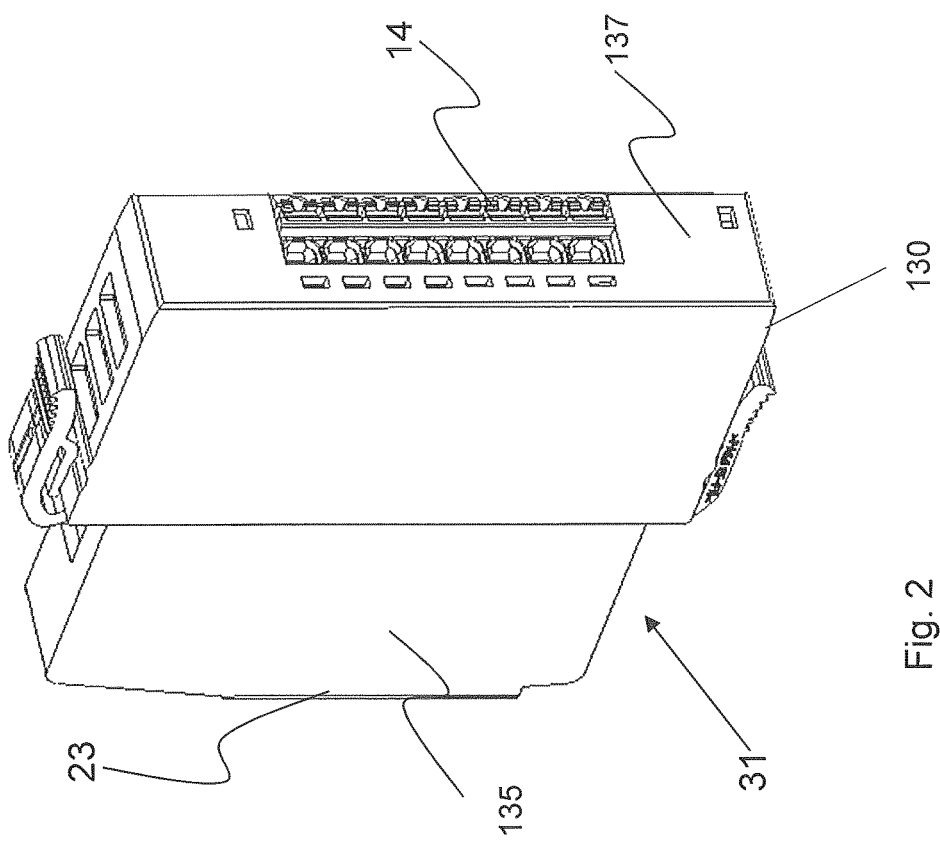
FIG. 2 shows an input/output functional module.

FIG. 10 illustrates the modular bus system 100 shown in FIG. 1 with a header module 4 and with the receptacle bodies 90 removed, so that the backplane printed circuit boards 21 are shown exposed. Header module 4 can be electrically connected to a backplane printed circuit board 43 which in turn can be attached to a support plate 42 to be mounted on the support rail 1. An electrical connector 12 is arranged on backplane printed circuit board 42, for electrical connection to a base module 2. Also illustrated is the inside configuration of the input/output functional module 31 as shown in FIG. 2, for example.

As can be seen in FIG. 10, each base module 2 has a backplane printed circuit board 21 with a main plane or base that is usually arranged in a vertical plane when the support rail 1 is mounted in a control cabinet. In other words, the base of backplane printed circuit boards 21 of the base modules shown in FIG. 1 lies in the x-z plane, while the bases of the backplane printed circuit boards 21 as shown in FIG. 10 lie in the y-z plane. As shown in FIG. 1, each base module 2 further comprises a plurality of receptacle areas 11a and 11b, for example in the form of box-like or receptacle-like plug-in slots, into which a respective input/output functional module can be inserted in the y-direction or perpendicular to the base 1a of the support rail and hence perpendicular to a backplane printed circuit board 21. Such an input/output functional module is shown in FIG. 2, for example, and is denoted by reference numeral 31. For example, each base module 2 has six receptacle areas or plug-in slots 11a and 11b, and the three plug-in slots 11a and three plug-in slots 11b may be arranged symmetrically with respect to the x-axis or to the longitudinal axis of support rail 1, for example. In other words, each respective pair of receptacle areas 11a and 11b forms a group of receptacle areas which lie on an imaginary line that extends in parallel to the z-axis. Thus, the receptacle areas 11a and 11b belonging to a respective group are arranged perpendicular to the longitudinal axis of support rail 1 and lie in the same plane as the base 1a of support rail 1. Each group of receptacle areas 11a and 11b may as well have more than two receptacle areas 11a and 11b arranged along a line in parallel to the z-axis. The base modules 2 shown in FIG. 1 by way of example thus each have three groups, each one comprising two receptacle areas 11a and 11b, and the groups are arranged in tandem, i.e. one after the other along the x-axis or the longitudinal axis of support rail 1.

The receptacle areas 11a and 11b shown in FIG. 1 by way of example may each have a rectangular cross-sectional shape, and the longitudinal axes of the receptacle areas of a group are lying on a line which extends in parallel to the z-axis. Each receptacle area 11a and 11b has a predetermined height extending in the y-direction. The six receptacle areas 11a and 11b may be integrated in a unitary receptacle body 90, for example, which for instance is a part made of plastics. It should be noted that each receptacle body 90 includes at least one group of at least two receptacle areas 11a and 11b. The receptacle body 90 primarily serves to guide input/output functional modules 31 when they are being inserted and then to support them.

As can be seen in FIGS. 1 and 10, for example, each base module 2 further comprises a support plate 80 on which the respective backplane printed circuit board 21 is mounted, preferably in detachable manner. Each base module 2 can be mounted to the support rail 1 using such a support plate 80. For this purpose, each support plate 80 has respective retaining and/or latching means.

In the assembled state, each receptacle body 90 is attached on a support plate 80 so that each backplane printed circuit board 21 is surrounded by the support plate 80 on the bottom side and by the receptacle body 90 on the lateral sides thereof. This is best seen in FIG. 1 in conjunction with FIG. 10.

As can be furthermore seen from FIG. 10, a plurality of first electrical connectors 70a and 70b is arranged on each backplane printed circuit board 21 and is electrically connected to an electronic device 110 mounted on the backplane printed circuit board 21. Thus, each base module 2 includes an integrated electronic device. The first electrical connectors 70a and 70b may be in the form of electrical connector blocks or electrical plug-in slots which are arranged in alignment with the receptacle areas 11a and 11b when the receptacle body 90 is mounted. In other words, a respective pair of first electrical connectors 70a and 70b forms a group lying on an imaginary line in parallel to the z-axis. So they extend perpendicular to the longitudinal axis of support rail 1 and lie in the same plane as the base 1a of support rail 1 or in a plane which is parallel to the base 1a. Each group may as well comprise more than two first electrical connectors 70a and 70b.

Thus, each of the base modules 2 shown in FIG. 10 by way of example have three groups each one comprising two first electrical connectors 70a and 70b, and the groups are arranged one after the other along the y-axis or longitudinal axis of the support rail 1. The electrical connectors 70a and 70b shown in FIG. 10 each have a rectangular cross-sectional shape, with the longitudinal axis of each electrical connector in parallel to the z-axis. The electrical connectors 70a and 70b of a group thus lie on a line extending in parallel to the z axis.

Figure 3:
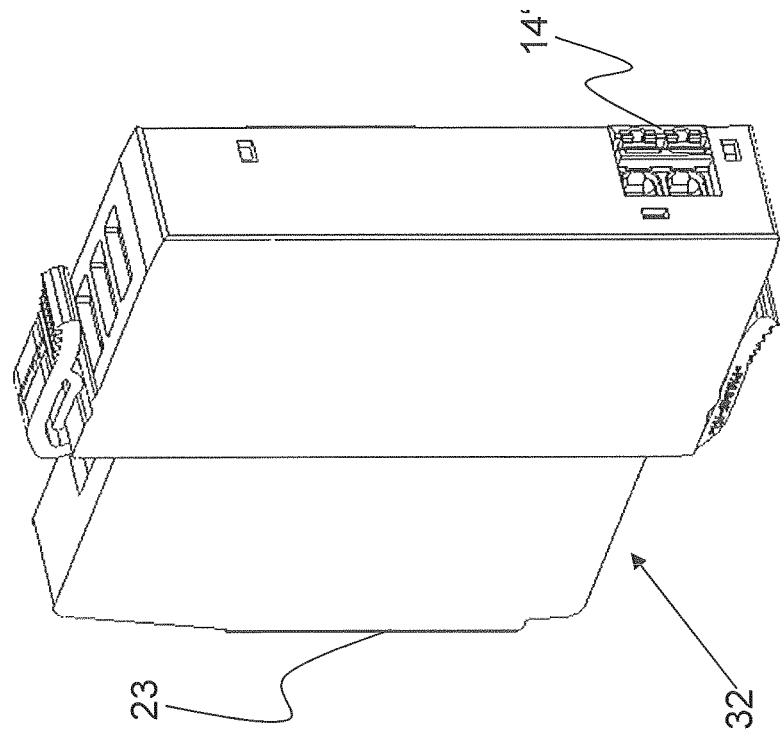
FIG. 3 shows a further input/output functional module.
Figure 4:
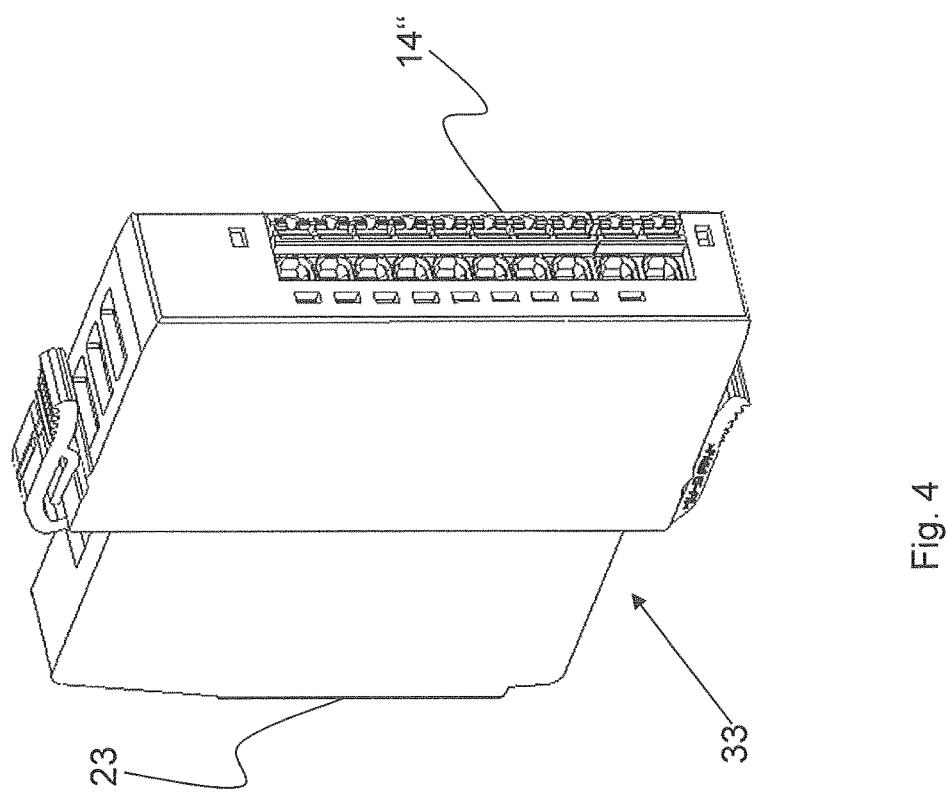
FIG. 4 shows a further input/output functional module.
Figure 7:
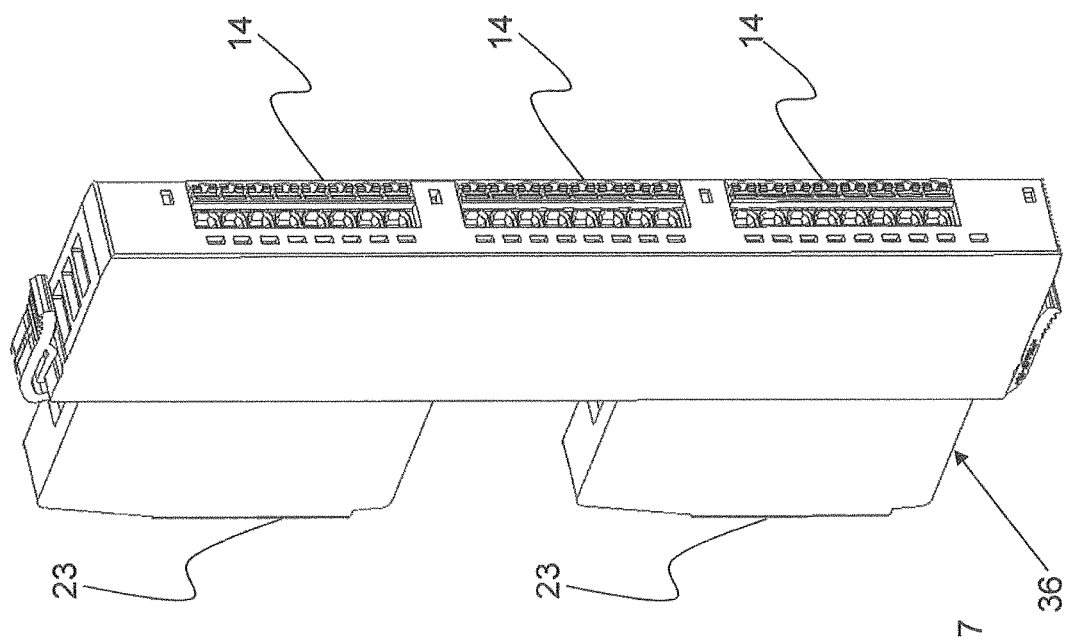
FIG. 7 shows a further input/output functional module.

Each input/output functional module shown in FIGS. 2 to 4 by way of example includes a circuit board 22, as can be seen in FIG. 10, which is referred to as a functional circuit board, and mounted thereto is an electronic device 120 and an electrical connector 23 that is complementary to the electrical connectors 70a and 70b of backplane printed circuit boards 21. Electrical connector 23 of each input/output functional module is arranged on the bottom side of functional circuit board 22, which is facing the base 1a of support rail 1 in the assembled state, so that it can be mated with one of the first electrical connectors 70a or 70b when the input/output functional module is installed in a base module 2. Moreover, a further electrical connector 14 can be arranged on the functional circuit board 22 of each input/output functional module, which can be used to connect an external device, such as a sensor or an actuator (not illustrated). The further electrical connector 14 is arranged on an end of functional circuit board 22 opposite to the end where the electrical connector 23 is arranged. Electrical connectors 23 and 14 may have a rectangular cross-sectional shape with a respective longitudinal axis aligned in z-direction when the respective input/output functional module is seated in a receptacle area 11a or 11b in the mounted state.

The input/output functional module 31 shown in FIG. 2 can be inserted into one of the receptacle areas 11a or 11b in y-direction, and in the inserted state the electrical connector 23 of the input/output functional module 31 will be electrically mated with, i.e. connected to one of the first electrical connectors 70a or 70b. This state is shown in FIG. 10, for example.

FIG. 9 shows an input/output functional module 31 in the inserted state, for example.

With respect to the orientation of the support rail 1 as shown in FIG. 10, an input/output functional module, such as the input/output functional module 31 shown in FIG. 2, is inserted into a respective receptacle area 11a or 11b in x-direction, while with an orientation of the support rail 1 as shown in FIG. 1 or 9, it is inserted into a respective receptacle area 11a or 11b in y-direction.

The electronic device 110 of each backplane printed circuit board 21 shown in FIG. 10 may include an evaluation and control means that may be adapted to detect whether an electrical connector 70a and/or 70b is electrically connected to an input/output functional module, and if so, which one(s) of the electrical connector(s) 70a and/or 70b is/are electrically connected to a respective input/output functional module. This is possible because electrical connectors 70a and 70b are connected to the electronic device 110 in a predefined order.

Each backplane printed circuit board 21 includes at least one second electrical connector 12a and/or 12b arranged on a lateral side of backplane printed circuit board 21, the lateral side being in parallel to the z-axis of the coordinate system shown in FIG. 1 when the respective base module 2 is mounted on the support rail 1. Preferably, each backplane printed circuit board 21 includes two second electrical connectors 12a and 12b, a respective one arranged on either lateral side thereof. The two second electrical connectors 12a and 12b of a respective backplane printed circuit board 21 are complementary, for example in the form of a plug connector and a socket connector, and will be aligned with the second electrical connectors 12a or 12b of adjacent base modules 2 as soon as a plurality of base modules 2 are mounted on the support rail 1. The second electrical connectors 12 are thus used for electrically connecting the base modules 2 to each other. In practice, base modules 2 are slidably displaced relative to each other on the support rail 1 until they are closely adjacent to one another and a reliable electrical connection is established to each other, as is shown in FIG. 9, for example. When the base modules 2 are arranged closely adjacent to each other, the box-like or socket-like receptacle areas 11a and 11b as shown in FIG. 1, for example, define vertical plug-in slots in the form of a grid with two rows of grid units. The grid can be equipped with input/output functional modules in any desired and suitable arrangement.

The electronic device 110 of each backplane printed circuit board 21 shown in FIG. 10 is able to drive a switching network that can be integrated in the electronic device 110, such that the first electrical connectors 70a and 70b and the second electrical connectors 12a and 12b can be selectively interconnected. In this way, input/output functional modules connected to the first electrical connectors 70a and/or 70b of a base module 2 are capable of selectively communicating with each other and/or with input/output functional modules of adjacent base modules 2 via the second electrical connectors 12. This communication is controlled by the electronic devices 110 of the respective base modules 2 or the respective associated backplane printed circuit boards 21 and by the electronic devices 120 integrated in the respective input/output functional module. Alternatively, each backplane printed circuit board 21 may include a switching network which connects in fixed manner the first electrical connectors 70a and 70b and the second electrical connectors 12a and 12b. In this way, the input/output functional modules and also the base modules 2 can communicate with a header module 5 which includes an electronic device that is appropriately configured for this purpose. Header module 5 is shown in FIG. 9, inter alia.

The electronic device 120 of each input/output functional module may include a memory (not shown) which stores information about the functionality, the manufacturer, or other module-specific identifiers of the respective input/output functional module, for example. Information about functionality include, for example, information about an input/output functional module having an analog input, a digital input, a digital output, and/or an analog output. The electronic device 120 of each input/output functional module may be adapted to detect whether the input/output functional module is electrically connected to a base module 2. Each input/output functional module may furthermore be adapted to transmit the stored information to the electronic device 110 of the base module 2, with or without request from the electronic device 110 of the base module 2 to which the input/output functional module is connected. Accordingly, upon detection of a plugged input/output functional module, the electronic device 110 of each base module 2 or each backplane printed circuit board 21 may be adapted to request the electronic device 120 of the detected input/output functional module to supply the stored information.

FIGS. 2 to 7 illustrate input/output functional modules 31 to 36 of various embodiments.

FIG. 2 shows the input/output functional module 31 with a housing 130 that includes the functional printed circuit board 22 shown in FIG. 10 arranged therein. Also, the electrical connector 14 as illustrated in FIG. 10 can be seen, which is also referred to as a front vertical plug-in slot, to which an external device such as, for example, a sensor or actuator can be connected. Furthermore, electrical connector 23 illustrated in FIG. 10, which faces the base 1a of support rail 1, is indicated in FIG. 2. Electrical connector 23 may also be referred to as a rear vertical plug-in slot, since it is inserted in the y-direction into a receptacle area 11a or 11b and therefore in vertical orientation with respect to the base 1a of support rail 1. The housing 130 has a housing portion 135 with a cross-sectional shape which essentially corresponds to the cross-sectional shape of receptacle areas 11a and 11b shown in FIG. 1, so that the housing portion 135 can be inserted into one of the receptacle areas 11a or 11b. Housing 130 may have a second housing portion 137 of a larger cross section than that of housing portion 135. The dimensions of housing portions 135 and 137 in the y-direction of the coordinate system shown in FIG. 1 are such that in the inserted state the protruding peripheral part of housing portion 137 will engage on the outer rim of the respective receptacle area 11a or 11b, and the respective first connector 70a or 70b of a backplane printed circuit board 21 is electrically connected to the electrical connector 23 of functional circuit board 22 of input/output functional module 31. In FIG. 10 it can be seen that the outer contour of functional circuit board 22 conforms with the shape of housing 130.

The embodiments of input/output functional modules 31, 32, and 33 fit a respective one of vertical plug-in slots 11a or 11b of the base module 2 and can therefore be inserted into the upper as well as the lower row of vertical slots 11a or 11b of base modules 2. The embodiments of the input/output functional modules 31 to 34 shown in FIGS. 2 to 4 only differ in the number of terminal contacts or the size of the respective electrical connectors 14, 14', and 14".

Figure 5:
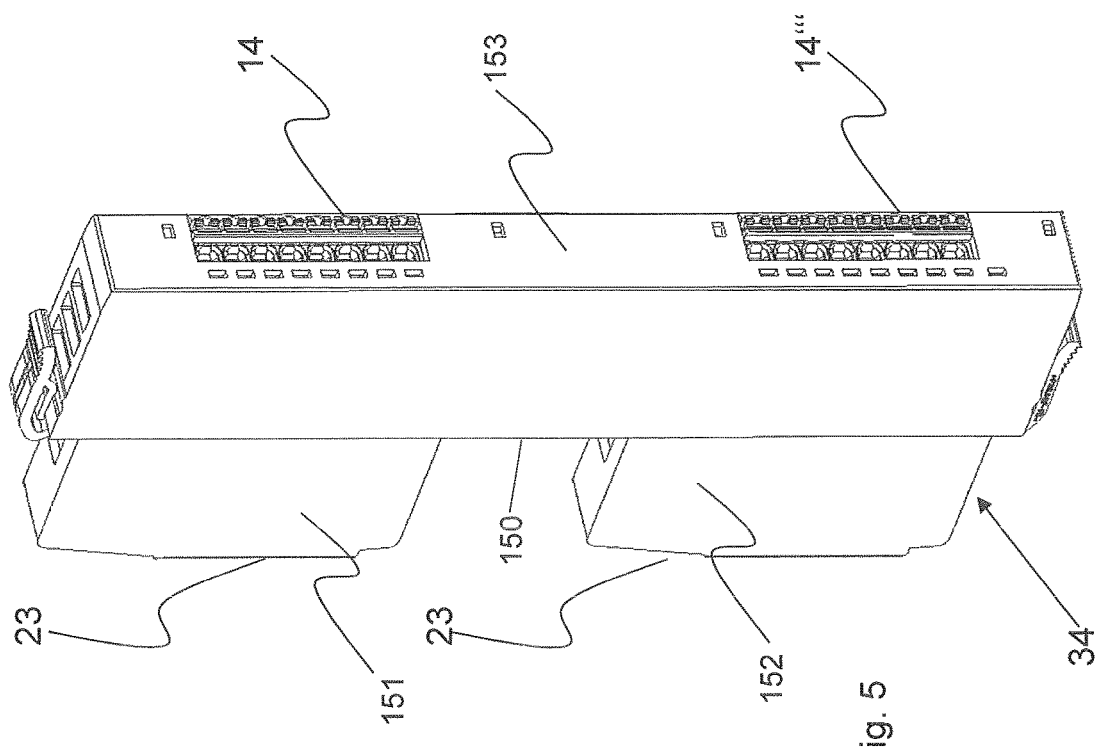
FIG. 5 shows a further input/output functional module.
Figure 6:
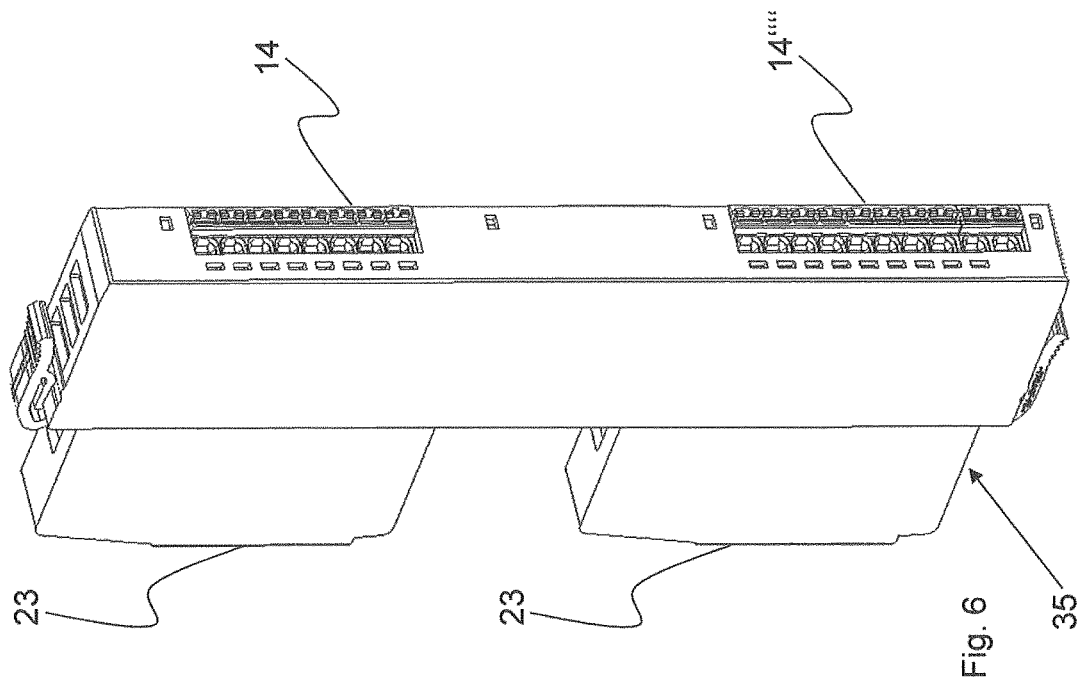
FIG. 6 shows a further input/output functional module.

Input/output functional modules 34 and 35 shown in FIGS. 5 and 6 each have a housing 150, each one with two input/output functional modules arranged therein. They only differ in the size of electrical connectors 14''' and 14'''', respectively. Housing 150 accommodates two separate functional printed circuit boards, each of which with a function and configuration that may correspond to that of functional printed circuit board 22 shown in FIG. 10. Housing 150 has two housing portions 151 and 152 extending in y-direction and each having a cross section that is slightly smaller than the cross section of the two receptacle areas 11a and 11b shown in FIG. 1. Housing 150 further has a housing portion 153 extending in the z-direction, with the two housing portions 151 and 152 adjoined thereto. The two housing portions 151 and 152 are arranged with a spacing therebetween in the z-direction, the spacing corresponding to the spacing between two adjacent receptacle areas 11a and 11b in z-direction. Electrical connectors 14, 14''', 14'''', and 23 are respectively indicated. Housing 150 or the two input/output functional modules arranged therein can thus be inserted into a group of receptacle areas 11a and 11b as shown in FIG. 1. The input/output functional module 36 shown in FIG. 7 differs from the embodiments shown in FIGS. 5 and 6 only in the fact that a third electrical connector 14 is provided.

FIG. 8 shows the modular bus system 100 illustrated in FIG. 1, with the three base modules 2 combined into a block and electrically interconnected, and with input/output functional modules 31 to 35 of the various embodiments about to be coupled thereto. Also shown are the receptacle bodies 90 of the three base modules 2.

FIG. 9 illustrates the exemplary bus system 100 with three base modules 2 coupled thereto, wherein the receptacle bodies 90 having been removed therefrom. Input/output functional modules 31 to 35 are coupled to the base modules 2. In addition, a header module 4 and a bus coupler 5 are illustrated, which are each electrically connected to an appropriate base module or a corresponding backplane printed circuit board. Header module 4 is connected to the header base module 42 which includes three further plug connectors or plug-in slots of the type of plugs or electrical connectors 16, 17 illustrated in FIG. 12. The header module 4 itself is equipped with respective mating connectors (not shown) corresponding to the rear vertical plug-in slots 23 of the input/output functional modules. Bus coupler 5 furthermore includes network ports 51 for connecting another bus system or another network, and one other port 53.

It should be pointed out that, for reasons of illustration, the individual parts are shown spaced from each other, while in the final assembled state the base modules 2 and the header module 4 will adjoin each other and form a functional unit.

Figure 11:
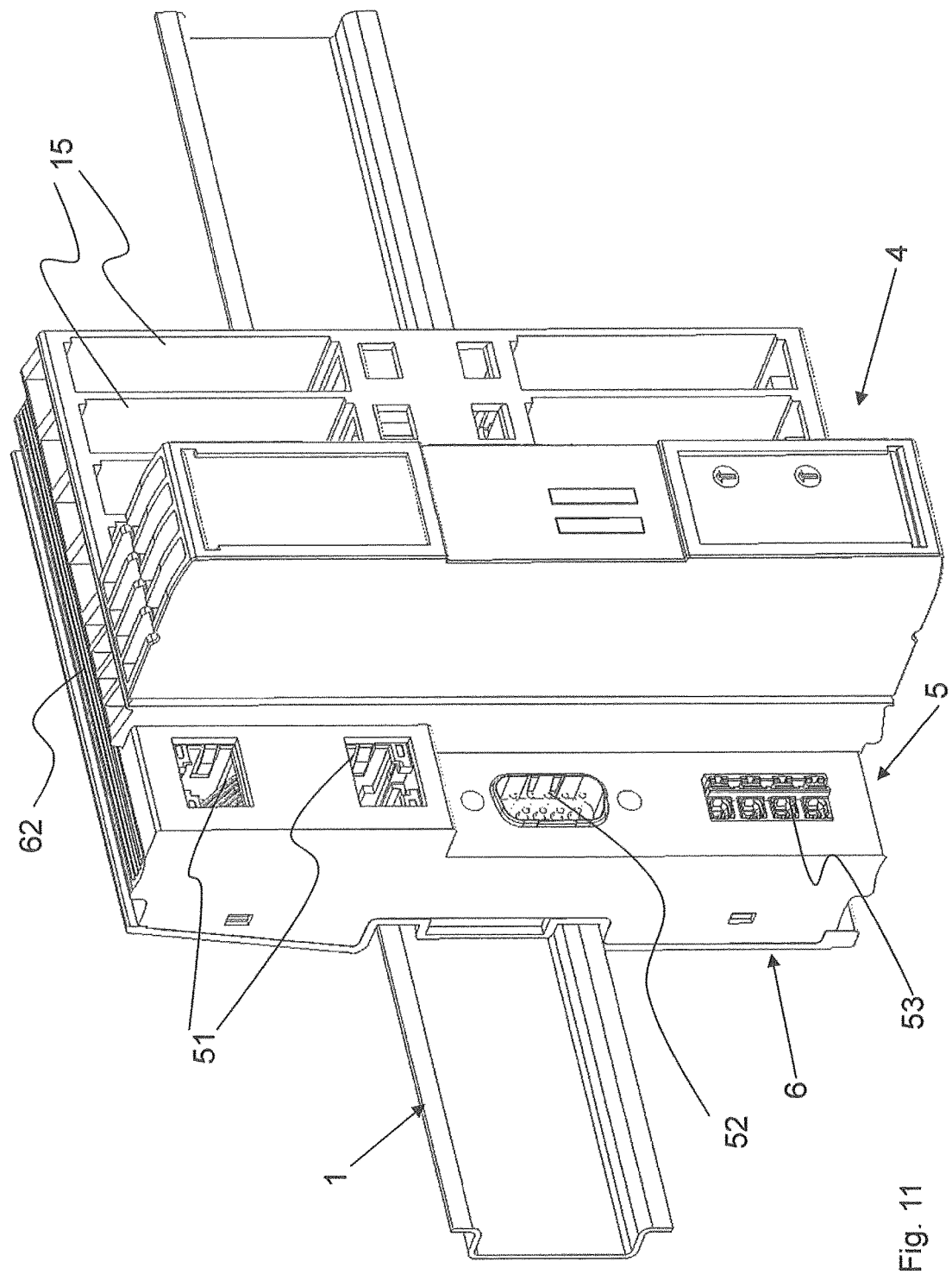
FIG. 11 shows a base block module with an integrated bus coupler.

FIG. 11 illustrates a basic block module 6 mounted to support rail 1, which comprises a fixed combination of the functional units of header module 4, bus coupler 5 and a bridging base module 62 with receptacle areas 15. In addition to network ports 51, the bus coupler 5 moreover includes a computer port 52 and one other port 53.

Figure 12:
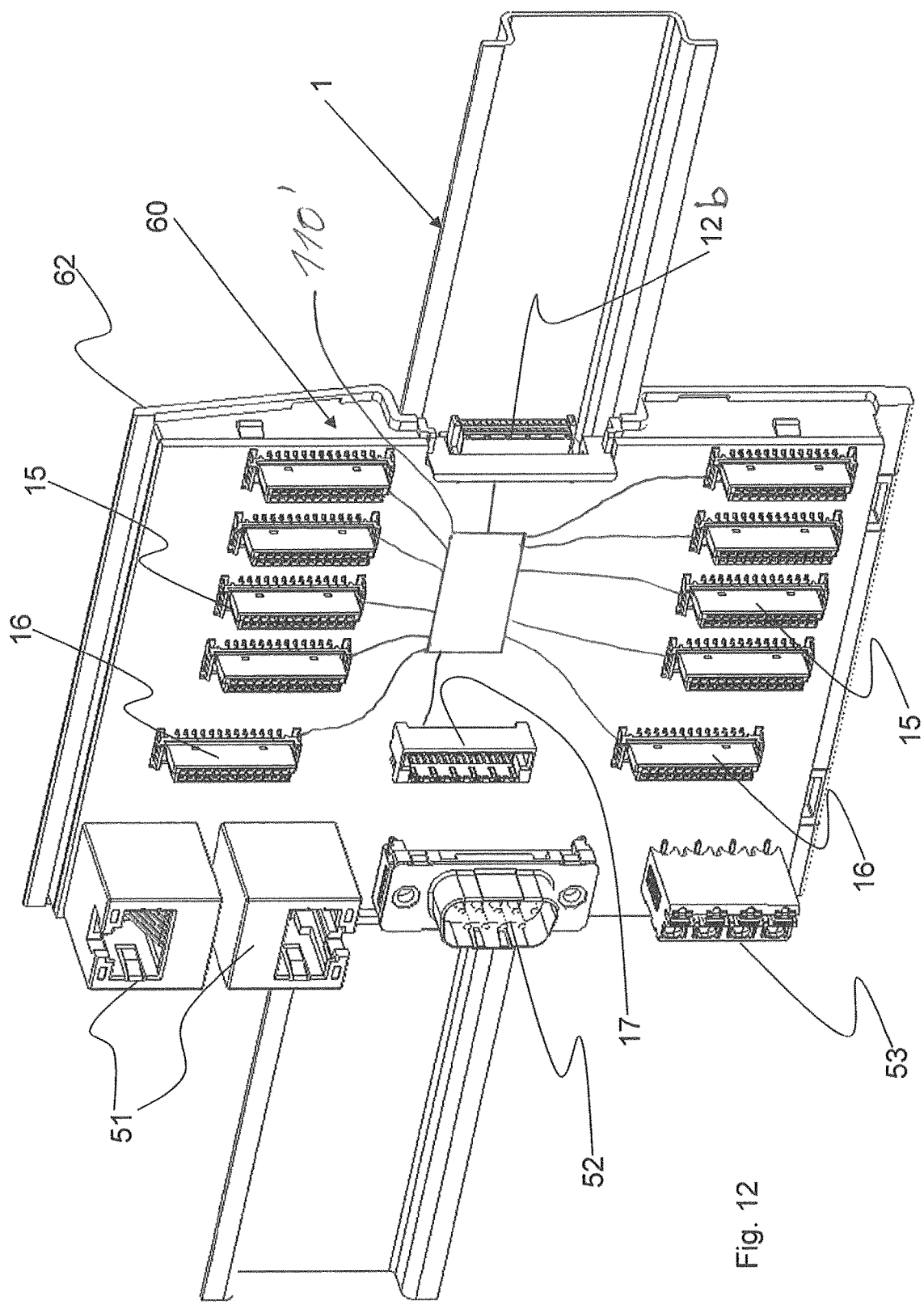
FIG. 12 shows an exposed backplane printed circuit board of the base block module illustrated in FIG. 11.

FIG. 12 shows the exposed backplane printed circuit board 60 of the base block module 6 shown in FIG. 11, on which all ports or electrical connectors 51, 52, 53, 12, and 15 as well as 16 and 17 are disposed, which are appropriate or required for a modular bus system comprising input/output functional modules. Furthermore, an electronic device 110' may be provided on the backplane printed circuit board 60, which may include a microcontroller or microprocessor and also a memory device. Preferably, it can perform all the functions of electronic device 110. In particular, it may be adapted to identify whether at least one of electrical connectors 15 and/or 16 and/or 17 is electrically connected to an input/output functional module, and if so, which electrical connector(s) is/are electrically connected to an input/output functional module. This is possible because the electrical connectors 15, 16, and 17 are connected to the electronic device 110' in a fixed order. It should be noted that electrical connectors 51-53 and 12 may as well be connected to the electronic device 110'.

Electronic device 110' is capable of controlling a switching network (not shown), which may be integrated in the electronic device 110', in a manner so that the electrical connectors 15 to 17 and the electrical connectors 12a and 12b can be selectively interconnected electrically. In this way, it is possible for input/output functional modules which are connected to the first electrical connectors 15 to 17 to selectively communicate with one another and/or, via the second electrical connectors 12, with input/output functional modules of adjacent base modules 2. This communication is controlled by the electronic devices 110' and by the electronic devices 120, which are integrated in the respective input/output functional modules. Alternatively, the backplane printed circuit board 60 may include a switching network which connects the first electrical connectors 15 to 17 and the second electrical connectors 12a and 12b in fixed manner.

Figure 13:
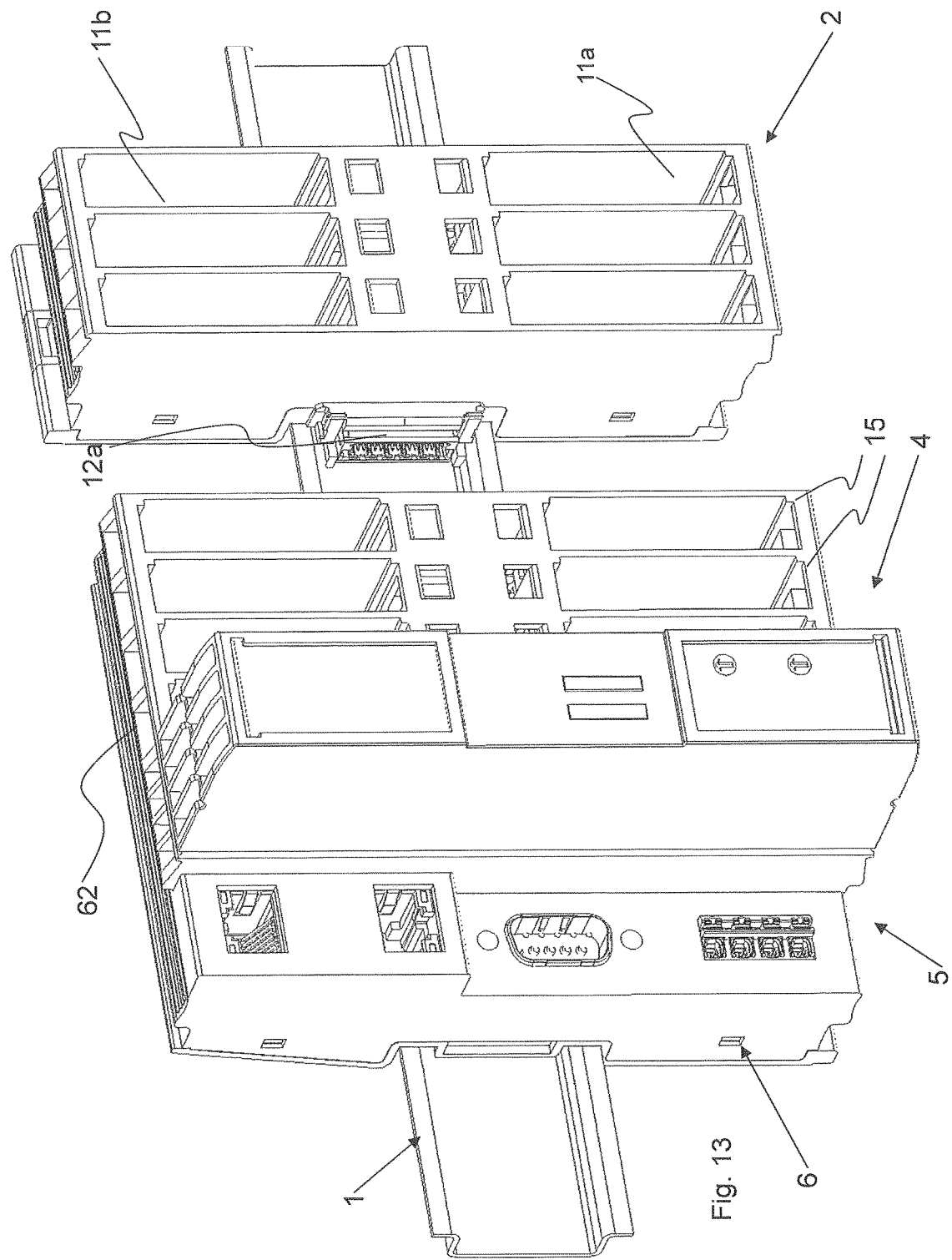
FIG. 13 shows a further exemplary modular bus system with the base block module illustrated in FIG. 11 next to a base module as illustrated in FIG. 1.

A base module 2 can be connected to base block module 6 via an electrical connector 12, as illustrated in FIG. 13. In this manner, the number of electrical connectors 70a and 70b can be extended.

Figure 14:
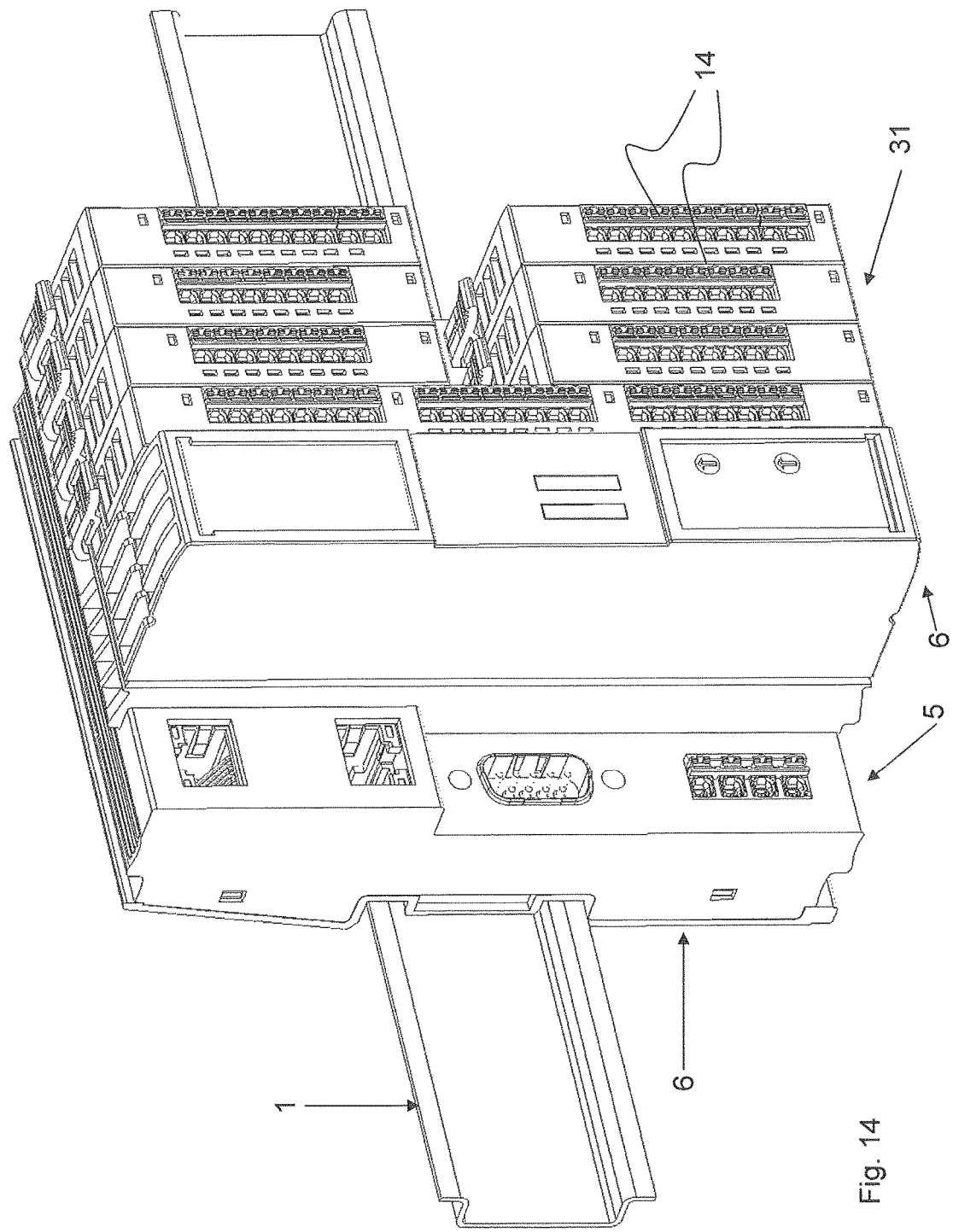
FIG. 14 shows the modular bus system of FIG. 13, with the base block module coupled to the base module that is equipped with input/output functional modules.

FIG. 14 shows the basic block module 6 of FIG. 13 with base module 2 coupled thereto and with input/output functional modules plugged thereto, thus forming a complete input/output bus station as a modular block.

The invention claimed is:

1. A modular bus system, comprising:
a support rail having a base and a longitudinal axis;
at least one base module mountable on the support rail for electrical connection to at least one input/output functional module, the at least one base module having a backplane printed circuit board with at least one group of at least two first electrical connectors connected thereto for electrical connection to an electrical connector of an input/output functional module, wherein the at least two first electrical connectors of the at least one group are arranged one after the other along an imaginary line which extends perpendicular to the longitudinal direction of the support rail and lie in a plane in which the base of the support rail is located or which is parallel to the base;
at least one input/output functional module comprising an electrical connector and an electronic device for communication with the modular bus system, wherein the electrical connector of the input/output functional module is configured for being electrically connected to one of the electrical connectors of the at least one base module;
an electronic device arranged on the backplane printed circuit board of the at least one base module, which is configured for communication with the electronic device of the at least one input/output functional module;
wherein the electronic device of the at least one base module is electrically connected to the at least two first electrical connectors and to a second electrical connector for being electrically connected to a complementary second electrical connector of a further base module and is adapted to detect whether an input/output functional module is connected to any one of the at least two first electrical connectors, and if so, to which one of the first electrical connectors an input/output functional module is connected.

2. The modular bus system as claimed in claim 1, wherein on at least one side of the backplane printed circuit board of the at least one base module, which is perpendicular to the longitudinal axis of the support rail, the second electrical connector is arranged for being electrically connected to the complementary second electrical connector of the further base module, the complementary second electrical connector being arranged on a side of a backplane printed circuit board of the further base module, which is perpendicular to the longitudinal axis of the support rail.

3. The modular bus system as claimed in claim 1, wherein the electronic device of the at least one base module is configured to selectively connect the first electrical connectors and the at least one second electrical connector so that input/output functional modules connected to the at least one base module are able to communicate with each other and/or with the electronic device and/or with input/output functional modules that are connected to another base module.

4. The modular bus system as claimed in claim 1, wherein the at least one base module comprises a receptacle body including at least one group of at least two receptacle areas, wherein each receptacle area extends perpendicular to the base of the support rail and is configured to accommodate at least part of an input/output functional module, wherein the at least two receptacle areas of the at least one group are arranged one after the other along an imaginary line which is perpendicular to the longitudinal direction of the support rail and lie in a plane in which the base of the support rail is located or which is parallel to the base, wherein each receptacle area is associated with one of the first electrical connectors.

5. The modular bus system as claimed in claim 4, wherein the at least one base module includes a support plate which is mountable to the support rail and is configured to support the backplane printed circuit board and the receptacle body.

6. The modular bus system as claimed in claim 1, further comprising a header module that is electrically connectable to a header base module, wherein the header base module includes an electrical connector for being electrically connected to the at least one base module.

7. The modular bus system as claimed in claim 6, wherein the header module is configured for communication with the input/output functional modules connected to the at least one base module.

8. The modular bus system as claimed in claim 6, further comprising a bus coupler which is connected to the header module via the header base module.

9. The modular bus system as claimed in claim 8, wherein the header module and the bus coupler in fixed combination define a base block module which includes a bridging base module that comprises a backplane printed circuit board with an electrical connector and/or with a plurality of electrical connectors for connecting input/output functional modules, and/or three further electrical connectors for connecting the header module and/or network ports and/or a computer port and/or another port.

10. The modular bus system as claimed in claim 1, wherein a plurality of base modules are arranged side by side on the support rail along the longitudinal axis of the support rail.

* * * * *